United States Patent
Dougherty

(10) Patent No.: US 9,488,714 B2
(45) Date of Patent: Nov. 8, 2016

(54) METHODS AND SYSTEMS FOR CONTINUOUS CALIBRATION OF CIRCUIT BREAKER TRIP UNITS AND METERING DEVICES

(71) Applicant: General Electric Company, Schenectady, NY (US)

(72) Inventor: John James Dougherty, Collegeville, PA (US)

(73) Assignee: General Electric Company, Schenectady, NY (US)

( * ) Notice: Subject to any disclaimer, the term of this patent is extended or adjusted under 35 U.S.C. 154(b) by 819 days.

(21) Appl. No.: 13/841,094

(22) Filed: Mar. 15, 2013

(65) Prior Publication Data
US 2014/0278179 A1  Sep. 18, 2014

(51) Int. Cl.
| | | |
|---|---|---|
| *G01R 35/00* | (2006.01) | |
| *H02H 3/00* | (2006.01) | |
| *H02J 13/00* | (2006.01) | |
| *H01H 69/01* | (2006.01) | |
| *H02H 7/26* | (2006.01) | |

(52) U.S. Cl.
CPC ............ *G01R 35/005* (2013.01); *H02H 3/006* (2013.01); *H02J 13/0062* (2013.01); *H01H 69/01* (2013.01); *H02H 7/263* (2013.01)

(58) Field of Classification Search
CPC .... G01R 35/005; H01H 69/01; H02H 3/006; H02H 7/263
See application file for complete search history.

(56) References Cited

U.S. PATENT DOCUMENTS

| | | | | | |
|---|---|---|---|---|---|
| 4,331,998 | A | * | 5/1982 | Matsko | G05B 19/08 361/93.2 |
| 4,876,625 | A | * | 10/1989 | Wolfe | H02H 7/222 361/63 |
| 4,996,646 | A | * | 2/1991 | Farrington | H02H 3/00 307/132 E |

(Continued)

FOREIGN PATENT DOCUMENTS

WO 03073176 A1 9/2003

OTHER PUBLICATIONS

Thomas et al., A Method for Controlled Fault Interruption for Use with HV SF6 Circuit Breakers, 2007, IEEE Power Tech 2007 Paper ID No. 365, pp. 1135-1140.*

(Continued)

*Primary Examiner* — John Breene
*Assistant Examiner* — Mohammad Islam
(74) *Attorney, Agent, or Firm* — General Electric Company

(57) ABSTRACT

A computer for continuous calibration of circuit breaker trip units and metering devices includes a processor and a memory device. The computer is configured to request and receive circuit breaker current data from a plurality of circuit breaker trip units. The circuit breaker current data represents current data associated with the circuit breaker trip units over a collection interval. The computer is configured to receive main current data from a main trip unit. The computer is configured to determine a plurality of calibration factors for the circuit breaker trip units based upon the circuit breaker current data and the main current data. The computer is additionally configured to transmit the calibration factors to the circuit breaker trip units.

20 Claims, 4 Drawing Sheets

(56) References Cited

U.S. PATENT DOCUMENTS

| | | | | |
|---|---|---|---|---|
| 5,325,315 A | * | 6/1994 | Engel | H01H 47/325 |
| | | | | 702/105 |
| 5,369,356 A | * | 11/1994 | Kinney | G01R 21/133 |
| | | | | 324/142 |
| 5,657,193 A | * | 8/1997 | Purkayastha | H02H 7/0822 |
| | | | | 361/115 |
| 5,734,576 A | * | 3/1998 | Klancher | H02H 7/30 |
| | | | | 324/424 |
| 5,768,148 A | * | 6/1998 | Murphy | H02J 13/001 |
| | | | | 700/286 |
| 6,462,921 B1 | * | 10/2002 | Bilac | H02H 3/006 |
| | | | | 361/18 |
| 7,016,174 B2 | | 3/2006 | Dougherty | |
| 7,129,688 B2 | | 10/2006 | Gemme et al. | |
| 7,599,161 B2 | | 10/2009 | Premerlani et al. | |
| 7,724,488 B2 | | 5/2010 | Krauss et al. | |
| 7,788,055 B2 | | 8/2010 | Walker Colsch et al. | |
| 2003/0086228 A1 | * | 5/2003 | Papallo, Jr. | H01H 71/123 |
| | | | | 361/93.1 |
| 2003/0184931 A1 | * | 10/2003 | Morris | H02H 11/005 |
| | | | | 361/42 |
| 2003/0193767 A1 | * | 10/2003 | Vicente | H02H 3/006 |
| | | | | 361/93.1 |
| 2006/0176630 A1 | * | 8/2006 | Carlino | H02H 1/0061 |
| | | | | 361/64 |
| 2008/0012667 A1 | * | 1/2008 | Colsch | H02H 3/006 |
| | | | | 335/18 |
| 2008/0157776 A1 | * | 7/2008 | Jaffer | H01H 71/123 |
| | | | | 324/424 |
| 2008/0158761 A1 | * | 7/2008 | Butland | H01H 71/7409 |
| | | | | 361/93.2 |
| 2008/0215278 A1 | * | 9/2008 | Colsch | H01H 69/01 |
| | | | | 702/85 |
| 2011/0128005 A1 | * | 6/2011 | Weiher | H02H 3/044 |
| | | | | 324/424 |
| 2012/0187937 A1 | | 7/2012 | Blake et al. | |
| 2013/0066478 A1 | * | 3/2013 | Smith | H02H 3/006 |
| | | | | 700/293 |
| 2013/0148249 A1 | * | 6/2013 | Schlotterer | H01H 71/123 |
| | | | | 361/115 |
| 2013/0345887 A1 | * | 12/2013 | Govindan | G06F 9/4893 |
| | | | | 700/291 |
| 2014/0078628 A1 | * | 3/2014 | Valdes | H02H 3/08 |
| | | | | 361/62 |
| 2014/0214218 A1 | * | 7/2014 | Eldridge | G01D 4/002 |
| | | | | 700/286 |

OTHER PUBLICATIONS

Mario Hoffmann, Peano—A Tool for On-Line Calibration Monitoring, OECD Halden Reactor Project—Institute for Energy Technology, 6 pages.

* cited by examiner

METHODS AND SYSTEMS FOR CONTINUOUS CALIBRATION OF CIRCUIT BREAKER TRIP UNITS AND METERING DEVICES

BACKGROUND

The field of the invention relates generally to computer-implemented programs and, more particularly, to a computer-implemented system for continuous calibration of circuit breaker trip units and metering devices.

Many known methods and systems of circuit protection require monitoring of current flowing through the circuit. Such methods and systems use monitoring devices, known as trip units or metering devices, at various branch points in the hierarchy of the circuit. Accurate monitoring of current flowing through the circuit, by the trip units, is important to protect the circuit.

Many known trip units become less accurate at lower levels of the hierarchy. For instance, the accuracy of a trip unit detecting current for a feeder or branch breaker will generally be lower than the accuracy of a monitoring device detecting current for a trip unit located at a circuit main. Such lower level trip units are less accurate for several reasons. First, at lower levels in the circuit hierarchy, a lack of physical space may be prohibitive for accurate sensors. More accurate sensors may simply require more room than is permitted. Second, high accuracy sensors can be expensive and therefore difficult to provision to lower levels of the hierarchy where greater numbers of trip units are required. Third, over time lower level trip unit sensors may change in accuracy.

As a result, many known trip units cannot accurately detect the current at lower levels of circuit hierarchy. In many known systems and methods, trip units have error ranges indicating, by a percentage, the reliability of a given reading from given trip unit. Despite this information, accurate resolution of the current at lower level trip units is still difficult to determine. First, the current is only known within a range given by the error range. Second, over time, the error range may change.

BRIEF DESCRIPTION

In one aspect, a computer-implemented system is provided. The system includes a plurality of circuit breaker trip units coupled to a plurality of circuit breaker tripping devices. The circuit breaker trip units are configured to monitor current associated with the circuit breaker tripping devices. The system also includes a main trip unit associated with a main tripping device. The main tripping device is electrically coupled to the plurality of circuit breaker tripping devices. The main trip unit is communicatively coupled to the plurality of circuit breaker trip units. The main trip unit is configured to monitor current associated with the main tripping device. The system further includes a networked computing device associated with the main trip unit. The networked computing device is in networked communication with the main trip unit the plurality of circuit breaker trip units. The networked computing device includes a processor and a memory device coupled to the processor. The networked computing device is configured to request and receive circuit breaker current data from the plurality of circuit breaker trip units. The circuit breaker current data represents current data associated with the circuit breaker trip units over a collection interval. The networked computing device is also configured to receive, from the main trip unit, main current data representing current data associated with the main tripping device during the collection interval. The networked computing device is further configured to determine a plurality of calibration factors associated with the circuit breaker trip units based upon circuit breaker current data and the main current data. The calibration factors represent variance between circuit breaker current data associated with a particular circuit breaker trip unit and a derived current associated with the particular circuit breaker trip unit. The networked computing device is additionally configured to transmit the calibration factors to the circuit breaker trip units.

In a further aspect, a computer-based method is provided. The computer-based method is performed by a networked computing device. The networked computing device includes a processor. The computing device also includes a memory device coupled to the processor. The networked computing device is in communication with a main trip unit a plurality of circuit breaker trip units. The main trip unit is configured to monitor current associated with a main tripping device. The plurality of circuit breaker trip units are configured to monitor current associated with a plurality of circuit breaker tripping devices. The method includes requesting and receiving circuit breaker current data from the circuit breaker trip units. The circuit breaker current data represents current data associated with the circuit breaker trip units over a collection interval. The method also includes receiving, from the main trip unit, main current data representing data associated with the main tripping device during the collection interval. The method further includes determining a plurality of calibration factors associated with the circuit breaker trip units based upon the circuit breaker current data and the main current data. The calibration factors represent variance between circuit breaker current data associated with a particular circuit breaker trip unit and a derived current associated with the particular circuit breaker trip unit. The method additionally includes transmitting the calibration factors to the circuit breaker trip units.

In another aspect, a computer is provided. The computer includes a processor. The computer also includes a memory device coupled to the processor. The computer is configured to request and receive circuit breaker current data from a plurality of circuit breaker trip units. The circuit breaker current data represents current data associated with the circuit breaker trip units over a collection interval. The computer is also configured to receive main current data from a main trip unit. The main current data represents current data associated with an associated main tripping device during the collection interval. The computer is further configured to determine a plurality of calibration factors associated with the circuit breaker trip units based upon the circuit breaker current data and the main current data. The calibration factors represent variance between circuit breaker current data associated with a particular circuit breaker trip unit and a derived current associated with the particular circuit breaker trip unit. The computer is additionally configured to transmit the calibration factors to the circuit breaker trip units.

DRAWINGS

These and other features, aspects, and advantages will become better understood when the following detailed description is read with reference to the accompanying drawings in which like characters represent like parts throughout the drawings, wherein.

Figure 1:
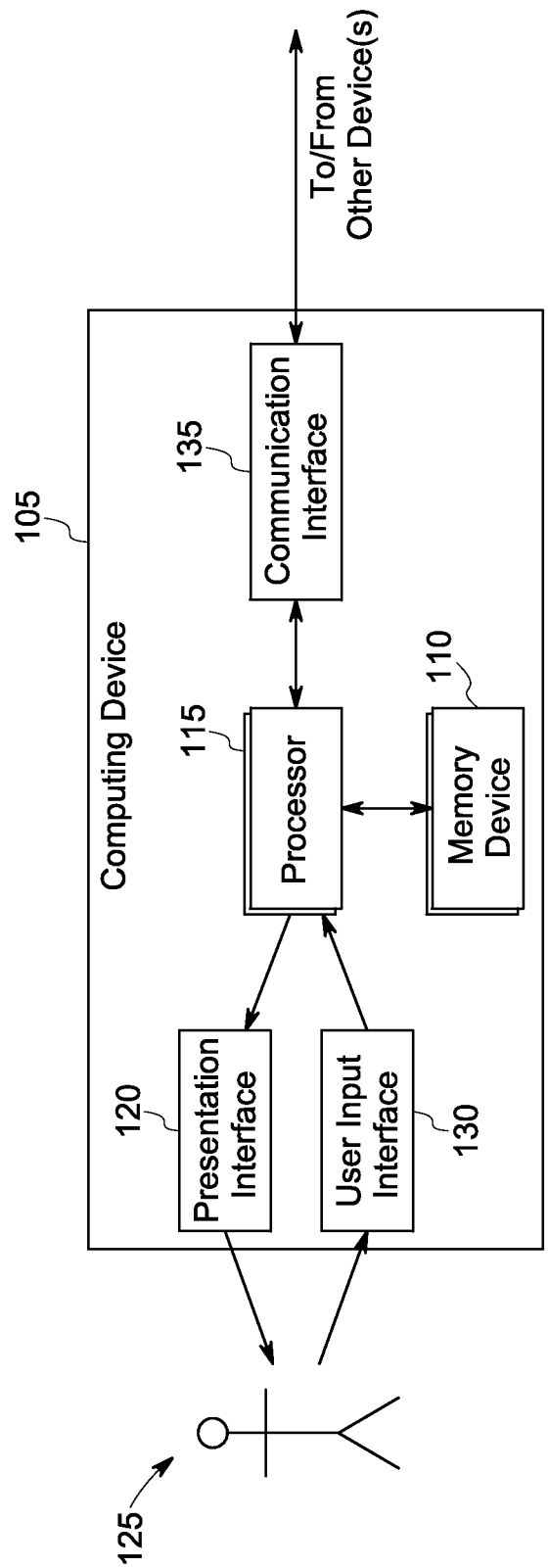
FIG. 1 is a schematic view of an exemplary computing device that may be used for continuous calibration of circuit breaker trip units and metering devices.
Figure 2:
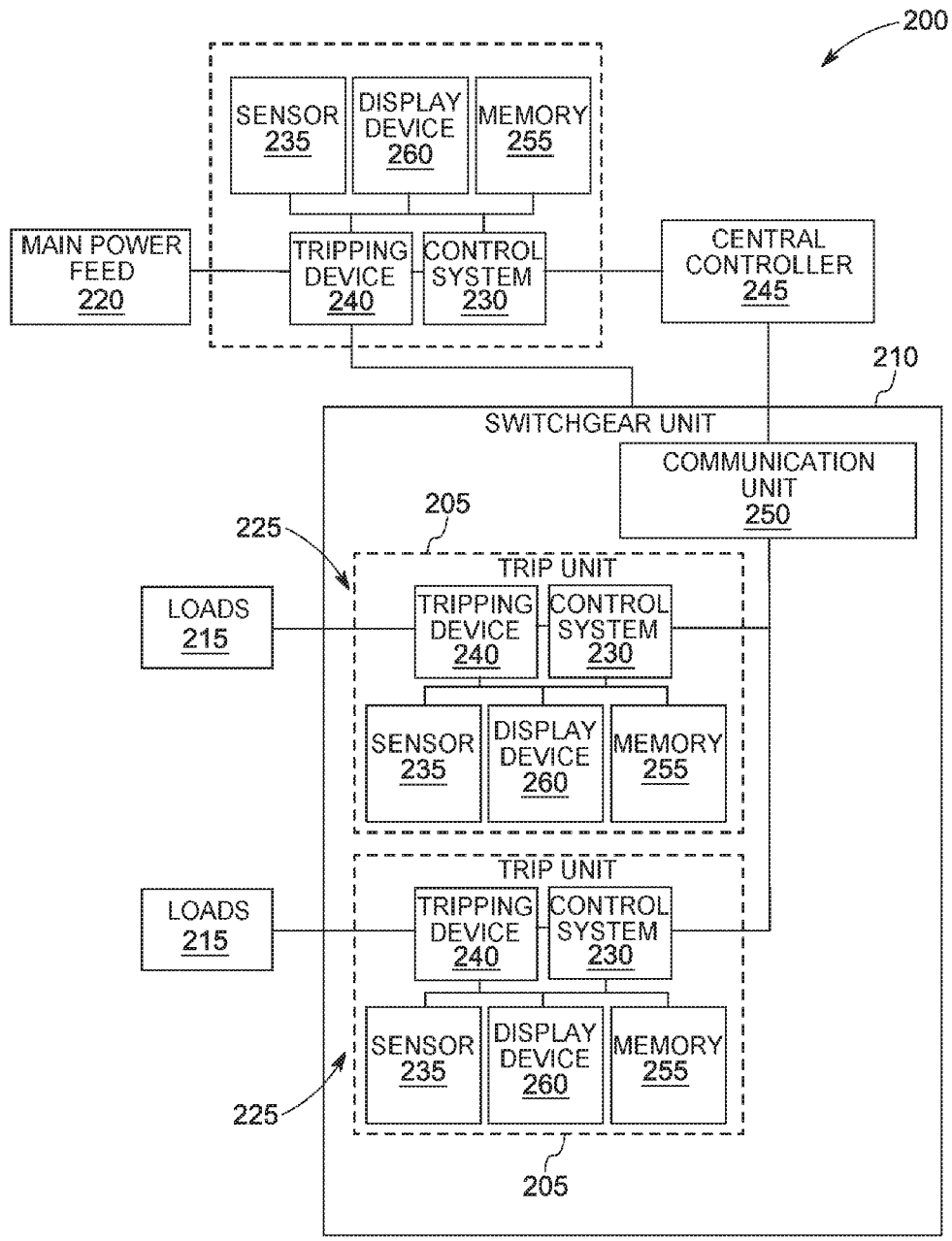
FIG. 2 is a schematic block diagram of a power distribution system including a plurality of circuit protection devices which may be used with the computing device of FIG. 1.
Figure 3:
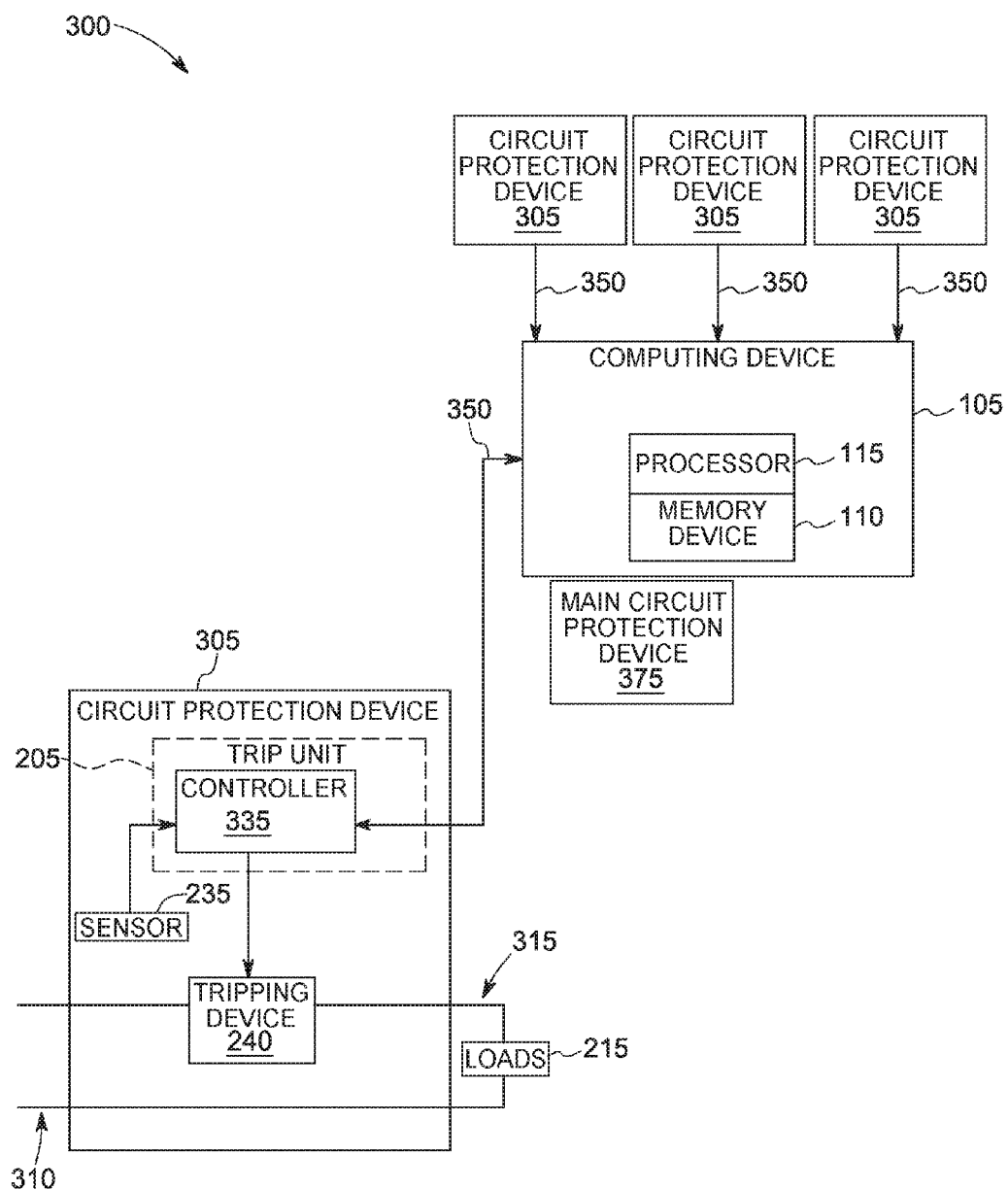
Figure 4:
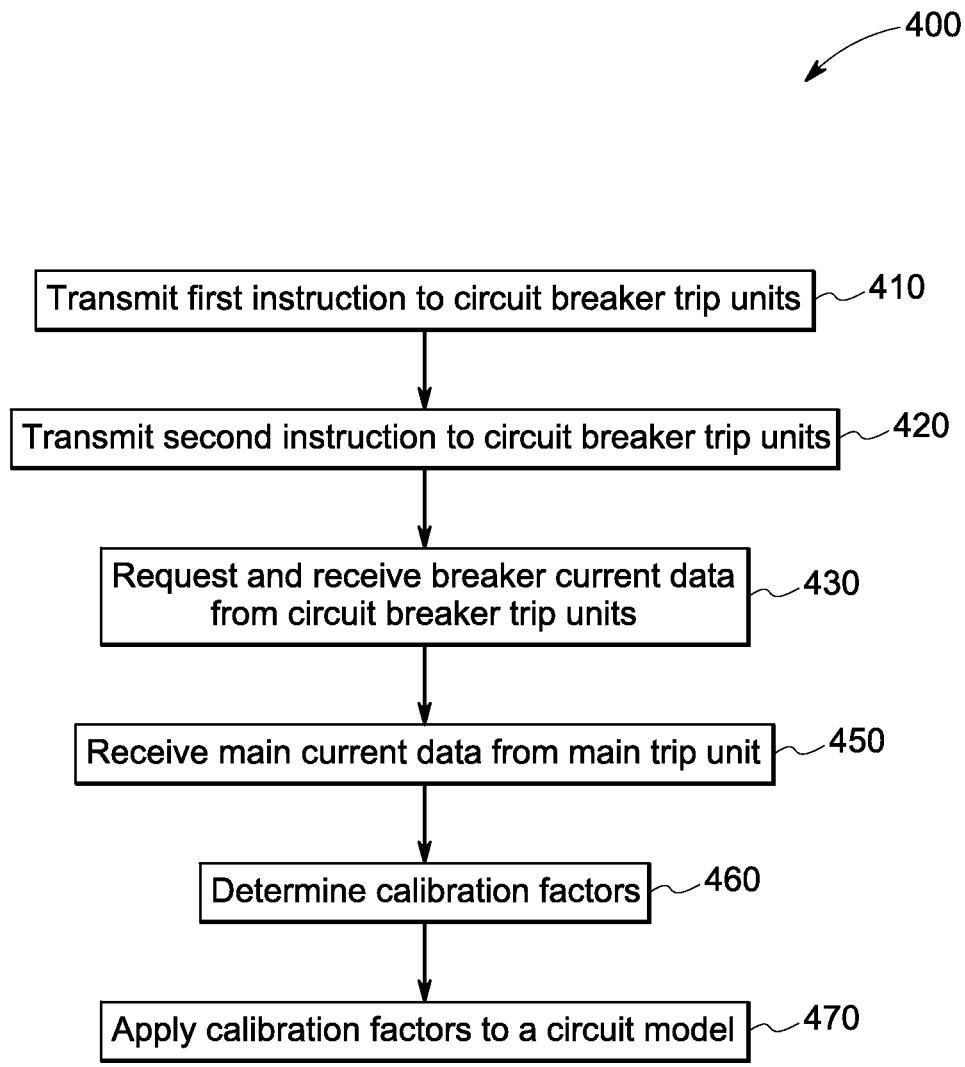

FIG. 3 is a diagram of an exemplary system for calibrating a circuit protection device using the computing device of FIG. 1 that may be used in the power distribution system of FIG. 2; and FIG. 4 is a method, used by the computing device of FIG. 1 in a networked configuration, for continuous calibration of circuit breaker trip units and metering devices in the power distribution system shown in FIG. 2.

Unless otherwise indicated, the drawings provided herein are meant to illustrate key inventive features of the invention. These key inventive features are believed to be applicable in a wide variety of systems comprising one or more embodiments of the invention. As such, the drawings are not meant to include all conventional features known by those of ordinary skill in the art to be required for the practice of the invention.

DETAILED DESCRIPTION

The systems and methods described herein allow for the continuous calibration of circuit breaker trip units and metering devices by using current data from a main trip unit and associated circuit breaker trip units over a collection interval to determine calibration factors for the circuit breaker trip units. Calibration factors represent a correction between current reported by a given circuit breaker trip unit and a derived circuit breaker trip unit current using external validation. External validation, in this example, refers to a method of using other current data to determine a derived current for a given circuit breaker trip unit. By using main trip unit data, known to represent all current received by the sum of all circuit breaker trip units, and at least one algorithm, a system of equations can be generated and solved for which represent the sum of calibrated circuit breaker current unit current data equating to the main trip unit current data. With sufficient data and over a sufficient time period, accurate calibration factors can be determined for circuit breaker trip units.

The systems and methods described herein facilitate continuous calibration of circuit breaker trip units and metering devices. Technical effects of the embodiments described herein include at least one of: (a) requesting and receiving, from a plurality of circuit breaker trip units, circuit breaker current data representing current data associated with the circuit breaker trip units; (b) receiving, from the main trip unit, main current data representing current data associated with the main tripping device; (c) determining calibration factors associated with the circuit breaker trip units based upon the circuit breaker current data and the main current data, calibration factors representing variance between circuit breaker current data associated with a particular circuit breaker trip unit and a derived current associated with the particular circuit breaker trip unit; and (d) transmitting the calibration factors to the circuit breaker trip units.

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

As used herein, the term "non-transitory computer-readable media" is intended to be representative of any tangible computer-based device implemented in any method or technology for short-term and long-term storage of information, such as, computer-readable instructions, data structures, program modules and sub-modules, or other data in any device. Therefore, the methods described herein may be encoded as executable instructions embodied in a tangible, non-transitory, computer readable medium, including, without limitation, a storage device and/or a memory device. Such instructions, when executed by a processor, cause the processor to perform at least a portion of the methods described herein. Moreover, as used herein, the term "non-transitory computer-readable media" includes all tangible, computer-readable media, including, without limitation, non-transitory computer storage devices, including, without limitation, volatile and nonvolatile media, and removable and non-removable media such as a firmware, physical and virtual storage, CD-ROMs, DVDs, and any other digital source such as a network or the Internet, as well as yet to be developed digital means, with the sole exception being a transitory, propagating signal.

As used herein, the terms "software" and "firmware" are interchangeable, and include any computer program stored in memory for execution by devices that include, without limitation, mobile devices, clusters, personal computers, workstations, clients, and servers.

As used herein, the term "computer" and related terms, e.g., "computing device", are not limited to integrated circuits referred to in the art as a computer, but broadly refers to a microcontroller, a microcomputer, a programmable logic controller (PLC), an application specific integrated circuit, and other programmable circuits, and these terms are used interchangeably herein.

Approximating language, as used herein throughout the specification and claims, may be applied to modify any quantitative representation that could permissibly vary without resulting in a change in the basic function to which it is related. Accordingly, a value modified by a term or terms, such as "about" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

FIG. 1 is a block diagram of an exemplary computing device 105 that may be used for continuous calibration of circuit breaker trip units and metering devices. Computing device 105 includes a memory device 110 and a processor 115 operatively coupled to memory device 110 for executing instructions. In the exemplary embodiment, computing device 105 includes a single processor 115 and a single memory device 110. In alternative embodiments, computing device 105 may include a plurality of processors 115 and/or a plurality of memory devices 110. In some embodiments, executable instructions are stored in memory device 110. Computing device 105 is configurable to perform one or more operations described herein by programming processor 115. For example, processor 115 may be programmed by encoding an operation as one or more executable instructions and providing the executable instructions in memory device 110.

In the exemplary embodiment, memory device 110 is one or more devices that enable storage and retrieval of information such as executable instructions and/or other data. Memory device 110 may include one or more tangible, non-transitory computer-readable media, such as, without limitation, random access memory (RAM), dynamic random access memory (DRAM), static random access memory (SRAM), a solid state disk, a hard disk, read-only memory (ROM), erasable programmable ROM (EPROM), electrically erasable programmable ROM (EEPROM), and/or non-volatile RAM (NVRAM) memory. The above memory types are exemplary only, and are thus not limiting as to the types of memory usable for storage of a computer program.

Memory device 110 may be configured to store operational data including, without limitation, circuit breaker current data, main current data, circuit current data, trip unit calibration factors, circuit models, trip unit health data, and trip unit condition data (all discussed further below). In some embodiments, processor 115 removes or "purges" data from memory device 110 based on the age of the data. For example, processor 115 may overwrite previously recorded and stored data associated with a subsequent time and/or event. In addition, or alternatively, processor 115 may remove data that exceeds a predetermined time interval. Also, memory device 110 includes, without limitation, sufficient data, algorithms, and commands to facilitate operation of the computer-implemented system (not shown in FIG. 1).

In some embodiments, computing device 105 includes a user input interface 130. In the exemplary embodiment, user input interface 130 is coupled to processor 115 and receives input from user 125. User input interface 130 may include, without limitation, a keyboard, a pointing device, a mouse, a stylus, a touch sensitive panel, including, e.g., without limitation, a touch pad or a touch screen, and/or an audio input interface, including, e.g., without limitation, a microphone. A single component, such as a touch screen, may function as both a display device of presentation interface 120 and user input interface 130.

A communication interface 135 is coupled to processor 115 and is configured to be coupled in communication with one or more other devices, such as a sensor or another computing device 105, and to perform input and output operations with respect to such devices. For example, communication interface 135 may include, without limitation, a wired network adapter, a wireless network adapter, a mobile telecommunications adapter, a serial communication adapter, and/or a parallel communication adapter. Communication interface 135 may receive data from and/or transmit data to one or more remote devices. For example, a communication interface 135 of one computing device 105 may transmit an alarm to communication interface 135 of another computing device 105. Communications interface 135 facilitates machine-to-machine communications, i.e., acts as a machine-to-machine interface.

Presentation interface 120 and/or communication interface 135 are both capable of providing information suitable for use with the methods described herein, e.g., to user 125 or another device. Accordingly, presentation interface 120 and communication interface 135 may be referred to as output devices. Similarly, user input interface 130 and communication interface 135 are capable of receiving information suitable for use with the methods described herein and may be referred to as input devices. In the exemplary embodiment, presentation interface 120 is used to visualize the data including, without limitation, circuit breaker current data, main current data, circuit current data, trip unit calibration factors, circuit models, trip unit health data, and trip unit condition data. User 125 may use user input interface 130 to execute tasks including, without limitation, adjusting calibration factors, staged startup or restart of circuit, and alarm detection. Such tasks may include the use of additional software which may facilitate such functions.

In the exemplary embodiment, computing device 105 is an exemplary embodiment of a computing device to be used in an exemplary high-level computer-implemented system for continuous calibration of circuit breaker trip units and metering devices (not shown in FIG. 1). In at least some other embodiments, computing device 105 is also an exemplary embodiment of other devices (not shown) used for continuous calibration of circuit breaker trip units and metering devices. In most embodiments, computing device 105 at least illustrates the primary design of such other devices.

FIG. 2 is a schematic block diagram of power distribution system 200 including a plurality of circuit protection devices 205 which may be used with computing device 105 (shown in FIG. 1). Each circuit protection device 205 is removably coupled within switchgear unit 210 and is configured to control power to one or more loads 215. In an exemplary embodiment, circuit protection device 205 is an electronic trip unit (ETU) 205, also referred to herein as a trip unit 205.

Loads 215 may include, but are not limited to only including, machinery, motors, lighting, and/or other electrical and mechanical equipment of a manufacturing or power generation or distribution facility. Power is provided to switchgear unit 210 from a main power feed 220, which is also coupled to trip unit 205. The power is then divided into a plurality of branch circuits 225 using trip unit 205 for providing power to loads 215.

Each trip unit 205 includes a control system 230, as well as at least one sensor 235 and at least one tripping device 240, such as one or more circuit breakers or arc containment devices coupled to control system 230. Exemplary circuit breakers include, for example, circuit switches and/or circuit interrupters that interrupt current flow through the circuit breaker to a load coupled to the circuit breaker. An exemplary arc containment device includes, for example, a containment assembly, a plurality of electrodes, a plasma gun, and a trigger circuit that causes the plasma gun to emit ablative plasma into a gap between the electrodes to divert energy into the containment assembly from an arc or other electrical fault that is detected on the circuit.

Sensor 235 measures at least one operating condition of tripping device 240 and/or of trip unit 205. In an exemplary embodiment, sensor 235 is a current sensor, such as a current transformer, a Rogowski coil, a Hall-effect sensor, and/or a shunt that measures a current flowing through tripping device 240 and/or trip unit 205. Alternatively, sensor 235 is a temperature sensor that measures a temperature of tripping device 240 and/or trip unit 205, or of ambient air in close proximity to tripping device 240 and/or trip unit 205. In some embodiments, sensor 235 is a humidity sensor 235 that measures a humidity or moisture content of ambient air surrounding, or in close proximity to, tripping device 240 and/or trip unit 205. In some embodiments, sensor 235 is a voltage sensor 235. Alternatively, sensor 235 may include a combination of temperature, humidity, voltage, and/or current sensors and/or any other type of sensor that enables power distribution system 200 to function as described herein. In an exemplary embodiment, each sensor 235 generates data representative of the measured current flowing through tripping device 240 and/or trip unit 205 (hereinafter referred to as "current data"). In addition, each sensor 235 transmits a signal including, or representing, the current data to a control system 230 associated with, or coupled to, tripping device 240. Each control system 230 is programmed to activate tripping device 240 to interrupt a current provided to a load 215 if the temperature data, humidity data, and/or any other operating condition data exceeds a programmable trip threshold.

In an exemplary embodiment, control systems 230 are also communicatively coupled to central controller 245. For example, in one embodiment, control systems 230 are directly coupled for communication with central controller 245. Alternatively, control systems 230 are coupled for communication with central controller 245 through a communication unit 250. Communication between control systems 230 and central controller 245 may also be provided through a hardwired communication link or through a wireless communication link. Control systems 230 collect measured operating condition data relating to a corresponding tripping device 240. For example, each control system 230 gathers measured operating condition data, such as measured current, voltage, temperature, and/or humidity data, from a sensor 235 associated with a tripping device 240 coupled to control system 230. In some embodiments, control system 230 periodically receives the measured operating condition data at a preselected frequency. For example, control system 230 receives temperature and/or humidity data at a frequency of about every minute, every hour, every day, or any other frequency. Control system 230 stores values representative of the temperature and/or humidity data in a memory 255 coupled to control system 230, and/or transmits the temperature and/or humidity data to central controller 245. In an alternative embodiment, some or all of the functionality of control systems 230 is incorporated into central controller 245.

Memory 255 stores program code and instructions, executable by control system 230, to control and/or monitor trip unit 205 and/or tripping device 240. In an exemplary embodiment, memory 255 includes non-volatile RAM to enable data stored in memory 255 to be retained after a power loss. Alternatively or additionally, memory 255 may include magnetic RAM (MRAM), ferroelectric RAM (Fe-RAM), read only memory (ROM), flash memory and/or Electrically Erasable Programmable Read Only Memory (EEPROM). Any other suitable magnetic, optical and/or semiconductor memory, by itself or in combination with other forms of memory, may be included in memory 255. Memory 255 may also be, or include, a detachable or removable memory, including, but not limited to, a suitable cartridge, disk, CD ROM, DVD or USB memory.

Trip unit 205 also includes a display device 260 coupled to control system 230. In an exemplary embodiment, display device 260 includes one or more light-emitting diodes (LEDs) that indicate a status of trip unit 205. For example, control system 230 may activate one or more components (e.g., LEDs) of display device 260 to indicate that trip unit 205 and/or tripping device 240 is active and/or operating normally, that a fault or failure has occurred, that a useful life of tripping device 240 or another component of trip unit 205 is below a threshold, and/or any other status of tripping device 240 and/or trip unit 205.

While trip unit 205 has been described in FIG. 2 with reference to switchgear units 210 of power distribution system 200, it should be recognized that trip unit 205, or any components thereof, may be used with any device or system. Additionally or alternatively, sensor 235 and control system 230 may monitor or measure operating conditions at, or in close proximity to, any other device or system other than tripping device 240.

FIG. 3 is a diagram of an exemplary system 300 for calibrating a circuit protection device 205 using computing device 105 (shown in FIG. 1) that may be used in power distribution system 200 (shown in FIG. 2). The system includes a circuit protection device 305. In this exemplary embodiment, circuit protection device 305 is a circuit breaker, and control system 205 is a trip unit. Circuit breaker 305 includes an input terminal 310 to receive a power input, such as from a main power feed, and an output terminal 315 to provide a power output to load 215. Tripping device 240 is coupled between input terminal 310 and output terminal 315. Tripping device 240 is configured to selectively interrupt a flow of electrical current between input terminal 310 and output terminal 315. Sensor 235 detects a characteristic associated with input terminal 310 and provides the characteristic, or a signal representative of the characteristic to trip unit 205. In the exemplary embodiment, sensor 235 detects an electric current through circuit protection device 305. Trip unit 205 controls operation of tripping device 240 to selectively interrupt the flow of current between input terminal 310 and output terminal 315 based, at least in part, on the electric current. The exemplary embodiment is a one pole, single phase circuit protection device. In other embodiments, circuit protection device 305 is a two, three, or four pole circuit breaker coupled to more than one phase of electrical current and/or a neutral conductor. Moreover, in some embodiments, circuit protection device 305 includes more than one tripping device 240, e.g., one coupled to each phase conductor and/or a neutral conductor.

Trip unit 205 includes a controller 335. Controller 335 receives the signal from sensor 235 and controls tripping device 240. In general, controller 335 detects, via sensor 235, an overcurrent condition, a short circuit, or other fault. In response, controller 335 causes tripping device 240 to trip to interrupt the flow of current through circuit protection device 305. Control of a tripping device, such as tripping device 240, by a controller, such as controller 335, is well known to those of ordinary skill in the art. Any suitable techniques for control of a tripping device by a controller may be used in connection with controller 335 and tripping device 240.

System 300 also includes computing device 105, described in FIG. 1. In the exemplary embodiment, computing device 105 is in networked communication with trip unit 205 and may be referred to herein as networked computing device 105. Networked computing device 105 includes processor 115 and memory device 110. Processor 115 and memory device 110 are coupled to one another. Networked computing device 105 is capable of communicating with trip unit 205 using network 350. In the exemplary embodiment, network 350 is a wireless cellular network. In other embodiments, network 350 may be any network capable of carrying data between trip unit 205 and networked computing device 105 including, without limitation, 802.11b networks, WANs, fiber networks, and IP networks. Processor 115 is configured to perform operations including, without limitation, sending instructions to trip unit 205, receiving data from trip unit 205, to determine calibration factors associated with trip unit 205, evaluating current data from trip unit 205 for stability, and to compare current data from trip unit 205 to historic current data from trip unit 205.

System 300 also includes main circuit protection device 375. Main circuit protection device 375 is coupled to networked computing device 105. Main circuit protection device 375 has a similar configuration to circuit protection device 305. However, main circuit protection device 375 is associated with a circuit main.

In the exemplary embodiment, system 300 includes four circuit protection devices 305. In alternative embodiments, any number of circuit protection devices 305 may be used. All circuit protection devices 305 are capable of sensing current data using sensor 235, receiving data from sensor 235 at controller 335, and communicating with networked computing device 105 using network 350.

In operation, networked computing device 105 requests and receives circuit breaker current data from trip units 205. Circuit breaker current data represents current flowing through trip unit 205 as detected by sensor 235. In the exemplary embodiment, circuit breaker current data is collected as the value of current squared, starting from zero. Circuit breaker current data is sent by trip unit 205 and received at memory device 110.

Networked computing device 105 also requests main current data from main circuit protection device 375. As discussed below, main current data is used to calibrate trip units 205 associated with circuit breaker current data. In the system, method, and computer described herein, it is assumed that main current data will generally be more accurate than circuit breaker current data. Main current data is generally more accurate because typical power distribution systems 200 will include more accurate trip units for mains than for circuit breakers. This is a result of far fewer numbers mains than circuit breakers allowing for greater expenditure, more physical space around typical mains than circuit breakers, and a greater significance of a main within power distribution system 200. Main circuit protection device 375 also calculates current passing through an associated trip unit and records the squared value of the current as main current data.

In some cases, networked computing device 105 will synchronize the received circuit breaker current data across all trip units 205 in order to ensure that data collection is uniform. In order for the calibration factors (discussed further below) to be determined accurately, circuit breaker current data and main current data must share a common collection interval or time-frame. In the exemplary embodiment, the collection interval is synchronized to ten seconds across all trip units 205. Networked computing device 105 may synchronize received circuit breaker current data by using a synchronizing signal including a start message or a time tag. The synchronizing signal may identify a specific time to initiate collection and cease collection. Networked computing device 105 may alternately use an external signal as a prompt to begin collecting circuit breaker current data. The external signal may use an external system (not shown) to synchronize the collection of all trip units 205. While data is collected by trip units 205 it is stored in associated memory 255 (shown in FIG. 2). Synchronizing the collection or circuit breaker current data may be particularly valuable because the phasor of the fundamental frequency of the current is used for protection purposes.

Networked computing device 105 processes circuit breaker current data associated with circuit protection devices 305 and main current data associated with main circuit protection devices 375 using processor 115. Processor 115 determines, for each trip unit 205 associated with circuit protection devices 305, a calibration factor. A calibration factor represents the variance between the circuit breaker current data received during the collection interval and a derived current data. By combining all circuit breaker current data with main current data, it can be possible to derive the actual variance of trip units 205 associated with circuit protection devices 305.

Several methods may be used to derive values for current data for circuit protection devices 305. In the exemplary embodiment, mean square regression may be used to derive correction factors. A simplified equation used to obtain such a regression may be represented as:

$$\hat{Y} = \beta_0 + \beta_1 X + \beta_2 X^2$$

In this equation, $\hat{Y}$ represents main current data, $\beta_Y$ is a calibration coefficient representing the error associated with a particular circuit breaker Y. X is the vector of individual downstream feeder measurements. As is indicated in this equation, main current data is used to determine calibration coefficients for circuit breakers. Because the regression determines circuit breaker calibration factors based upon main current data, the accuracy of main current data will directly impact the accuracy of circuit breaker calibration factors.

Alternately, processor 115 may alternately convert the sum of squares values received as circuit breaker current data and main current data into the actual amperage of each circuit breaker and the main. This method may be less appropriate for alternating current waveforms because accuracy may be difficult to achieve. Accordingly, mean square regression is preferable for alternating current waveforms.

Once calibration factors are determined, networked computing device 105 transmits the calibration factors to circuit breaker trip units 205. Circuit breaker trip units 205 can use calibration factors for use in calibrating circuit breaker current data in the future.

In some embodiments, it may be desirable to reduce the overhead associated with checking calibration factors. If it is believed that power distribution system 200 (shown in FIG. 2) is in a steady state, it may be desirable to suspend calibration processes. Networked computing device 105 may use processor 115 and memory device 110 to detect such a steady state. Networked computing device 105 may store calibration factors associated with circuit protection devices 305 for several iterations. At each circuit breaker current collection interval, new calibration factors may be compared to old calibration factors. If the calibration factors for circuit protection devices 305 repeat or repeat within a tolerance range, processor 115 may determine that calibration factors are stable. Networked computing device 105 may reduce or halt requesting circuit breaker current data, receiving circuit breaker current data, and determining calibration factors while a value for the main current data is determined to be within a stable threshold. The stable threshold defines the variance acceptable in main current data before a re-determination of calibration factors is justified. The stable threshold may be defined based upon correlation of historical calibration factor variance to main current data variance. The stable threshold may also be defined based upon historic variances in main current data with the presumption that variances outside these boundaries may indicate possible instability in power distribution system 200. The stable threshold will generally be defined based upon the maximum acceptable change in main current data given the requirements of a particular power distribution system 200.

In some embodiments, it may be desirable to perform a staged startup to determine calibration factors more effectively. A staged startup consists of turning on loads 215 in a sequence. The staged startup may turn on loads 215 to individual circuit protection devices 305 in a sequence, groups of individual circuit protection devices 305 in a sequence, or any other method of turning on loads 215 to circuit protection devices 305 at multiple times. This may be desirable where circuit breaker current data is held significantly constant and prevents derivation to the accuracy desired. In such embodiments, networked computing device 105 may be used to restart loads 215 (shown in FIG. 2) associated with circuit protection devices 305. By individually activating loads 215, it will be easier to derive calibration factors because the error in the accumulated measurement is all due to one circuit breaker.

In other embodiments, a pre-defined electrical condition may occur in power distribution system 200 including, for example, a fault condition. If a fault occurs during the data collection interval, networked computing device 105 may identify that at least some circuit protection devices 305 have moved to a different operating condition. In such cases, networked computing device 105 may determine that the fault has occurred by detecting that circuit breaker current data is outside pre-defined change limits. Change limits may be defined by, without limitation, user 125 (shown in FIG. 1) or pre-set in memory device 110. Change limits define the maximum acceptable change between a calibration factor for a particular circuit protection device 305 at a first collection interval and a calibration factor for the same circuit protection device at a second, subsequent, collection interval. Changes in calibration factors exceeding change limits may result in discarding the most recent calibration factor and beginning the determination of a new one.

If a fault is determined, computing device may modify the calibration factors associated with the at least some circuit protection devices 305. Calibration factors may need to be modified because the fault would otherwise cause at least temporary erroneous circuit breaker current data including, for example, distortion caused by saturation. If calibration factors were not modified, calibration factors would reflect such erroneous circuit breaker current data. Modifying the calibration factors may include using quadratic regression methods and ignoring the circuit breaker current data associated with the at least one circuit protection device 305 during the data collection interval. Quadratic regression may be used to calibrate such distorted data. However, results from times immediately preceding or following the fault condition may cause skewed results. In these situations, ignoring circuit breaker current data may be appropriate.

In other embodiments, a change in calibration factors may indicate that a particular circuit protection device 305 is changing or providing unacceptable data. As described above, memory device 110 may store historic calibration factors for a plurality of circuit protection devices 305. In such embodiments, processor 115 may compare, after each data collection interval, calibration factors to historic calibration factors. Processor 115 may determine whether an alert status should be indicated for the particular circuit protection device 305. The alert status may be detected because of a failure in at least one trip unit 205 or circuit protection device 305. The alert status may also be detected because of a drift in circuit breaker current data outside of a predetermined range. The predetermined range describes the maximum allowable change in circuit breaker data. The predetermined range is based upon the typical variance of circuit breaker data and the presumption that exceeding this variance indicates a change in condition of circuit protection device 305 or at least some components of power distribution system 200. Processor 115 may create a system alert. Creating a system alert may include, without limitation, recording an entry associated with circuit protection device 305, sending the system alert to other users and/or devices (not shown), and resetting the particular circuit protection device 305.

FIG. 4 is an overall method 400 used by networked computing device 105 (shown in FIG. 1), for continuous calibration of circuit breaker trip units and metering devices in the power distribution system 200 (shown in FIG. 2). Method 400 is implemented by networked computing device 105.

Networked computing device 105 requests and receives 410, from the circuit breaker trip units, the circuit breaker current data. Requesting and receiving 410 represents transmitting a request for circuit breaker current data from networked computing device 105 to a plurality of trip units 205 and receiving the same circuit breaker current data at networked computing device 105.

Networked computing device 105 also receives 420, from the main trip unit, main current data representing current data associated with the main tripping device during the collection interval. Receiving 420 represents receiving main current data from associated main circuit protection device 375.

Networked computing device 105 further determines 430 calibration factors associated with the circuit breaker trip units based upon the circuit breaker current data and the main current data. Determining 430 calibration factors represents applying methods and algorithms to determine a calibration factor for each circuit breaker trip unit 205.

Networked computing device additionally transmits 440 calibration factors to the circuit breaker trip units. Transmitting 440 calibration factors represents transmitting determined 430 calibration factors to each circuit breaker trip unit 205.

Described herein are exemplary systems and methods for continuous calibration of circuit breaker trip units and metering devices. More specifically, the methods and systems described herein facilitate accurate measurement of current data in circuit protection devices. The described systems and methods can be used to enhance circuit protection through improved data on calibration of such devices.

The methods and apparatus described herein facilitate enhanced operation of circuit protection devices. Exemplary embodiments of methods and systems are described and/or illustrated herein in detail. The methods and apparatus are not limited to the specific embodiments described herein, but rather, components of each apparatus, as well as steps of each method, may be utilized independently and separately from other components and steps described herein. Each component, and each method step, can also be used in combination with other components and/or method steps.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A system comprising:
a plurality of circuit breaker trip units coupled to a plurality of circuit breaker tripping devices, said circuit breaker trip units configured to monitor current associated with said circuit breaker tripping devices;
a main trip unit associated with a main tripping device, said main tripping device electrically coupled to said plurality of circuit breaker tripping devices, said main trip unit communicatively coupled to said plurality of circuit breaker trip units, said main trip unit configured to monitor current associated with said main tripping device; and
a networked computing device associated with said main trip unit, said networked computing device in networked communication with said main trip unit and with said plurality of circuit breaker trip units, said networked computing device including a processor, and a memory device coupled to said processor, said networked computing device configured to:
request and receive, from said plurality of circuit breaker trip units, circuit breaker current data representing current data associated with said circuit breaker trip units over a collection interval;
receive, from said main trip unit, main current data representing current data associated with said main tripping device during the collection interval;
determine a derived current for each circuit breaker trip unit of said plurality of circuit breaker trip units based on the main current data and the circuit breaker current data;
determine a calibration factor for each circuit breaker trip unit of said plurality of circuit breaker trip units, each calibration factor based upon the circuit breaker current data associated with a particular circuit breaker trip unit and the derived current associated with said particular circuit trip unit, the calibration factor representing variance between the circuit breaker current data and the derived current associated with said particular circuit breaker trip unit; and
transmit the calibration factors to said circuit breaker trip units, wherein each said circuit breaker trip unit is configured to store its calibration factor and adjust a current measurement of the current associated with said circuit breaker tripping device based on the stored calibration factor.

2. A system in accordance with claim 1 further configured to use a staged startup to determine the calibration factors, wherein the staged startup represents providing current to said circuit breaker tripping devices sequentially.

3. A system in accordance with claim 1 further configured to determine the calibration factors using mean square regression over the collection interval.

4. A system in accordance with claim 1 further configured to synchronize the received circuit breaker current data from said circuit breaker trip units by sending a communication to said circuit breaker trip units including at least one of:
a synchronizing signal including a start message or a time tag; and
an external signal.

5. A system in accordance with claim 1 further configured to:
determine a pre-defined electrical condition has occurred in at least one circuit breaker tripping device by detecting that received circuit breaker current data for said at least one associated circuit breaker trip unit is outside defined change limits; and
modify the determined calibration factors for said at least one associated circuit breaker trip unit by one of:
using quadratic regression methods; and
ignoring the circuit breaker current data associated with said at least one circuit breaker.

6. A system in accordance with claim 1 further configured to:
determine that the calibration factors of said plurality of circuit breaker trip units are stable; and
one of reducing the frequency of or halt requesting the circuit breaker current data, receiving the circuit breaker current data, and determining the calibration factors while a value for the main current data is determined to be within a stable threshold.

7. A system in accordance with claim 1 further configured to:
store, at said networked computing device, the calibration factors of said plurality of circuit breaker trip units for the collection interval;
compare the calibration factors to historic calibration factors; and
determine, based on a comparison of the calibration factors and the historic calibration factors, the presence of an alert status including at least one of:
a failure in at least one circuit breaker trip unit; and
a drift in the breaker current data outside a predetermined range; and
upon determining the alert status, create a system alert at said networked computing device.

8. A method for calibrating circuit breaker trip units, wherein said method is performed by a networked computing device, the networked computing device including a processor and a memory device coupled to the processor, the networked computing device in communication with a main trip unit and a plurality of circuit breaker trip units, the main trip unit configured to monitor current associated with a main tripping device, the plurality of circuit breaker trip units configured to monitor current associated with a plurality of circuit breaker tripping devices, said method including:
requesting and receiving, from the circuit breaker trip units, circuit breaker current data representing current data associated with the circuit breaker trip units over a collection interval;
receiving, from the main trip unit, main current data representing current data associated with the main tripping device during the collection interval;
determining a derived current for each circuit breaker trip unit of the plurality of circuit breaker trip units based on the main current data and the circuit breaker current data;
determining a calibration factor for each circuit breaker trip unit of the plurality of circuit breaker trip units, each calibration factor based upon the circuit breaker current data associated with a particular circuit breaker trip unit and the derived current associated with the particular circuit breaker trip unit, the calibration factor representing variance between the circuit breaker current data and the derived current associated with the particular circuit breaker trip unit; and
transmitting the calibration factors to the circuit breaker trip units, wherein each circuit breaker trip unit stores its calibration factors and adjusts a current measurement of the circuit breaker trip unit based on the stored calibration factor.

9. A method in accordance with claim 8 further including using a staged startup to determine the calibration factors, wherein the staged startup represents providing current to said circuit breaker tripping devices sequentially.

10. A method in accordance with claim 8, further comprising determining the calibration factors using mean square regression over the collection interval.

11. A method in accordance with claim 8, further comprising synchronizing the received circuit breaker current data from the circuit breaker trip units by sending a communication to the circuit breaker trip units including at least one of:
   a synchronizing signal including a start message or a time tag; and
   an external signal.

12. A method in accordance with claim 8, further comprising:
   determining a pre-defined electrical condition has occurred in at least one circuit breaker tripping device by detecting that received circuit breaker current data for the at least one associated circuit breaker trip unit is outside defined change limits; and
   modifying the determined calibration factors by one of:
      using quadratic regression methods; and
      ignoring circuit breaker current data associated with the at least one circuit breaker.

13. A method in accordance with claim 8, further comprising:
   determining that the calibration factors are stable; and
   one of reducing the frequency of or halting requesting the circuit breaker current data, receiving the circuit breaker current data, and determining the calibration factors while a value for the main current data is determined to be within a stable threshold.

14. A method in accordance with claim 8 further comprising:
   storing, at the networked computing device, the calibration factors for the collection interval;
   comparing the calibration factors to historic calibration factors; and
   determine, based on a comparison of the calibration factors and the historic calibration factors, the presence of an alert status including at least one of:
      a failure in at least one circuit breaker trip unit; and
      a drift in the breaker current data outside a predetermined range; and
   upon determining the alert status, creating a system alert at the networked computing device.

15. A computer including a processor and a memory device coupled to said processor, said computer configured to:
   request and receive, from a plurality of circuit breaker trip units, circuit breaker current data representing current data associated with the circuit breaker trip units over a collection interval;
   receive, from a main trip unit, main current data representing current data associated with an associated main tripping device during the collection interval;
   determine a derived current for each circuit breaker trip unit of the plurality of circuit breaker trip units based on the main current data and the circuit breaker current data;
   determine a calibration factor for each circuit breaker trip unit of the plurality of circuit breaker trip units, each calibration factor based upon the circuit breaker current data associated with a particular circuit breaker trip unit and the derived current associated with the particular circuit breaker trip unit, the calibration factor representing variance between the circuit breaker current data and the derived current associated with the particular circuit breaker trip unit; and
   transmit the calibration factors to the circuit breaker trip units, wherein each circuit breaker trip unit is configured to store its calibration factor and adjust a current measurement of the circuit breaker trip unit based on the stored calibration factor.

16. The computer of claim 15 further configured to use a staged startup to determine the calibration factors, wherein the staged startup represents providing current to said circuit breaker tripping devices sequentially.

17. The computer of claim 15 further configured to determine the calibration factors using mean square regression over the collection interval.

18. The computer of claim 15 further configured to synchronize the collection of the received circuit breaker current data from the circuit breaker trip units by sending a communication to the circuit breaker trip units including at least one of:
   a synchronizing signal including a start message or a time tag; and
   an external signal.

19. The computer of claim 15 further configured to:
   determine a pre-defined electrical condition has occurred in at least one circuit breaker tripping device by detecting that received circuit breaker current data for said at least one associated circuit breaker trip unit is outside defined change limits; and
   modify the determined calibration factors for the at least one associated circuit breaker trip unit by one of:
      using quadratic regression methods; and
      ignoring circuit breaker current data associated with said at least one circuit breaker.

20. The computer of claim 15 further configured to:
   determine that the calibration factors of the plurality of circuit breaker trip units are stable; and
   one of reduce the frequency of or halt requesting the circuit breaker current data, receiving the circuit breaker current data, and determining the calibration factors while a value for the main current data is determined to be within a stable threshold.

* * * * *